United States Patent
Komai et al.

(10) Patent No.: US 10,742,920 B2
(45) Date of Patent: Aug. 11, 2020

(54) IMAGE SENSOR, IMAGE-CAPTURING APPARATUS, AND ELECTRONIC DEVICE

(71) Applicant: NIKON CORPORATION, Tokyo (JP)

(72) Inventors: Atsushi Komai, Tokorozawa (JP); Wataru Funamizu, Yokohama (JP); Masahiro Juen, Yokohama (JP)

(73) Assignee: NIKON CORPORATION, Tokyo (JP)

( * ) Notice: Subject to any disclaimer, the term of this patent is extended or adjusted under 35 U.S.C. 154(b) by 0 days.

(21) Appl. No.: 15/764,003

(22) PCT Filed: Sep. 27, 2016

(86) PCT No.: PCT/JP2016/078496
§ 371 (c)(1),
(2) Date: Mar. 28, 2018

(87) PCT Pub. No.: WO2017/057381
PCT Pub. Date: Apr. 6, 2017

(65) Prior Publication Data
US 2018/0288347 A1    Oct. 4, 2018

(30) Foreign Application Priority Data
Sep. 30, 2015    (JP) .................................. 2015-195282

(51) Int. Cl.
*H04N 5/378*    (2011.01)
*H04N 5/374*    (2011.01)
(Continued)

(52) U.S. Cl.
CPC .............. *H04N 5/378* (2013.01); *H03M 1/56* (2013.01); *H04N 5/3698* (2013.01); *H04N 5/37455* (2013.01)

(58) Field of Classification Search
CPC .. H04N 5/378; H04N 5/3745; H04N 5/37455; H01L 27/1463; H04M 1/56; H03M 1/001; H03M 1/004; H03M 1/02
(Continued)

(56) References Cited

U.S. PATENT DOCUMENTS 8,063,350 B2 * 11/2011 McGarry ................ H01L 27/00
250/208.1
9,621,831 B2 * 4/2017 Inui ........................ H04N 5/369
348/300
(Continued)

FOREIGN PATENT DOCUMENTS

JP    2006-049361 A    2/2006
WO    2014/129118 A1    8/2014

OTHER PUBLICATIONS

Mar. 31, 2018 Office Action issued in Taiwanese Patent Application No. 105131634.
(Continued)

*Primary Examiner* — Marly S Camargo
(74) *Attorney, Agent, or Firm* — Oliff PLC

(57) ABSTRACT

An image sensor includes: a readout circuit that reads out a signal to a signal line, the signal being generated by an electric charge resulting from a photoelectric conversion; a storage circuit including an analog/digital converter that converts a first voltage signal based on an electric current from a first power supply circuit into a digital signal and a first storage unit that stores the first voltage signal converted into a digital signal by the analog/digital converter; and a first electric current source that supplies the signal line with an electric current generated by the first voltage signal stored in the first storage unit.

11 Claims, 11 Drawing Sheets

(51) Int. Cl.
*H03M 1/56* (2006.01)
*H03M 1/00* (2006.01)
*H03M 1/02* (2006.01)
*H01L 27/146* (2006.01)
*H04N 5/369* (2011.01)
*H04N 5/3745* (2011.01)

(58) Field of Classification Search
USPC .................... 348/308, 300, 302, 294, 230.1;
250/208.1; 341/126, 122, 135, 136, 155,
341/144, 172; 257/291, 292, 271
See application file for complete search history.

(56) References Cited

U.S. PATENT DOCUMENTS

| | | | |
|---|---|---|---|
| 2006/0023109 A1 | 2/2006 | Mabuchi et al. | |
| 2007/0247535 A1* | 10/2007 | Yoshida | H04N 5/335 |
| | | | 348/294 |
| 2008/0231491 A1* | 9/2008 | Muramatsu | H03M 1/34 |
| | | | 341/164 |
| 2008/0273093 A1 | 11/2008 | Okita et al. | |
| 2009/0040353 A1* | 2/2009 | Yamamoto | H04N 5/335 |
| | | | 348/308 |
| 2011/0317056 A1 | 12/2011 | Matsumoto | |
| 2012/0320243 A1* | 12/2012 | Hagibara | H04N 5/378 |
| | | | 348/294 |
| 2014/0160331 A1 | 6/2014 | Murakami et al. | |
| 2015/0244332 A1* | 8/2015 | Gendai | H03F 3/082 |
| | | | 327/543 |
| 2015/0271424 A1* | 9/2015 | Yamaoka | H04N 5/378 |
| | | | 348/300 |
| 2015/0357369 A1 | 12/2015 | Kobayashi et al. | |
| 2017/0318246 A1* | 11/2017 | Shim | H04N 5/3698 |
| | | | 348/308 |
| 2019/0082133 A1* | 3/2019 | Shikina | H04N 5/378 |
| | | | 348/241 |

OTHER PUBLICATIONS

Aug. 31, 2017 Office Action issued in Taiwanese Patent Application No. 105131634.
Dec. 20, 2016 International Search Report issued in International Patent Application No. PCT/JP2016/078496.
Jun. 4, 2019 Office Action issued in Japanese Patent Application No. 2017-543439.
Jun. 4, 2019 Office Action issued in Taiwanese Patent Application No. 105131634.
Aug. 2, 2019 Extended Search Report issued in European Patent Application No. 16851552.6.
Oct. 31, 2019 Office Action issued in Chinese Patent Application No. 201680057103.9.
May 22, 2020 Office Action issued in Indian Patent Application No. 201817013931.

* cited by examiner

FIG.1
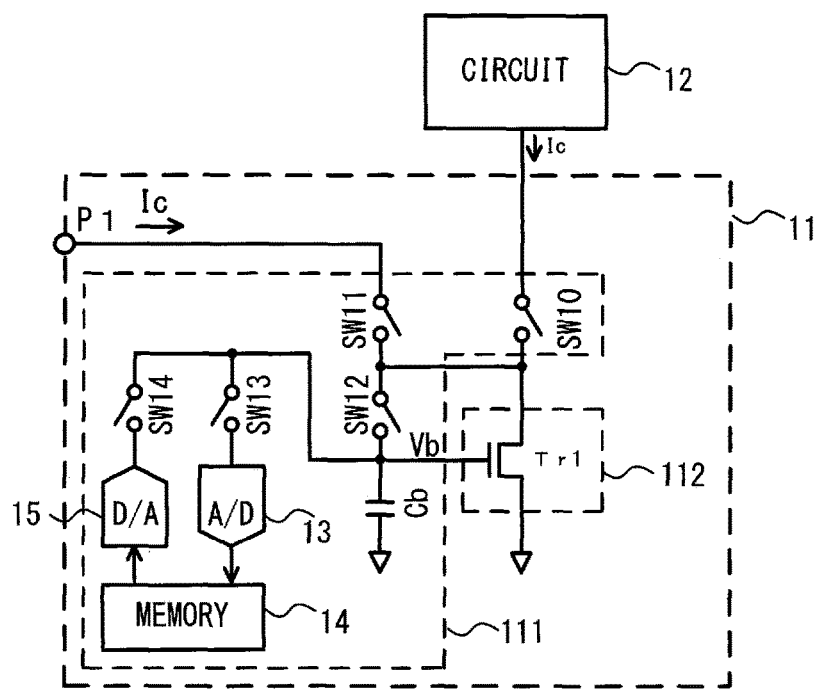
(A)
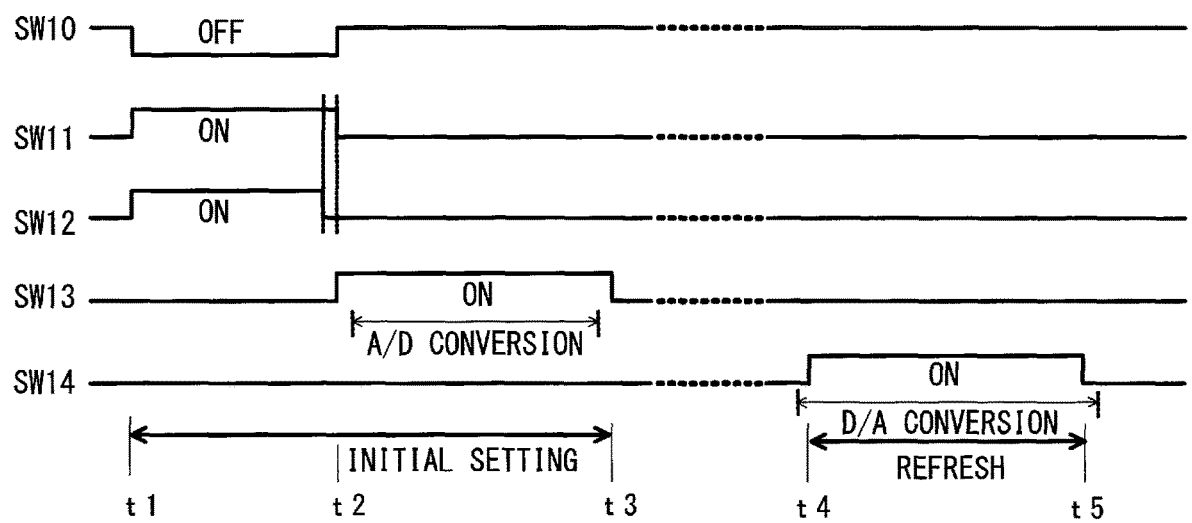
(B)

(A)

IMAGE SENSOR, IMAGE-CAPTURING APPARATUS, AND ELECTRONIC DEVICE

TECHNICAL FIELD

The present invention relates to an image sensor, an image-capturing apparatus, and an electronic device.

BACKGROUND ART

Pixel circuits are provided with load transistors that serves as electric current sources (PTL1). Generally, the pixel circuit is provided with an electric current source circuit including a capacitor and an electric current source for supplying an electric current source with a bias voltage, and a reference electric current is inputted to the capacitor of the electric current source circuit from an external reference electric current source. In order to hold the bias voltage of the capacitor, it is required to supply the reference electric current from the external reference electric current source. Additionally, as the number of pixel circuits increases, the required number of electric current source circuits increases accordingly. This leads to an increased reference electric current supplied from the external reference electric current source and thus an increased power consumption.

CITATION LIST

Patent Literature

PTL1: Japanese Laid-Open Patent Publication No. 2006-49361

SUMMARY OF INVENTION

According to the 1st aspect, an image sensor comprises: a readout circuit that reads out a signal to a signal line, the signal being generated by an electric charge resulting from a photoelectric conversion; a storage circuit including an analog/digital converter that converts a first voltage signal based on an electric current from a first power supply circuit into a digital signal and a first storage unit that stores the first voltage signal converted into a digital signal by the analog/digital converter; and a first electric current source that supplies the signal line with an electric current generated by the first voltage signal stored in the first storage unit.

According to the 2nd aspect, an electronic device comprises: an electronic circuit having a plurality of electronic components; a storage circuit including an analog/digital converter that converts a first voltage signal based on an electric current from a first power supply circuit into a digital signal, and a first storage unit that stores the first voltage signal converted into the digital signal by the analog/digital converter; and a first electric current source that supplies the electronic circuit with an electric current generated by the first voltage signal stored in the first storage unit.

BRIEF DESCRIPTION OF DRAWINGS

FIGS. 1(A) and 1(B) illustrate an electric current source circuit and a time sequence diagram according to a first embodiment.

DESCRIPTION OF EMBODIMENTS

First Embodiment

Figure 2:
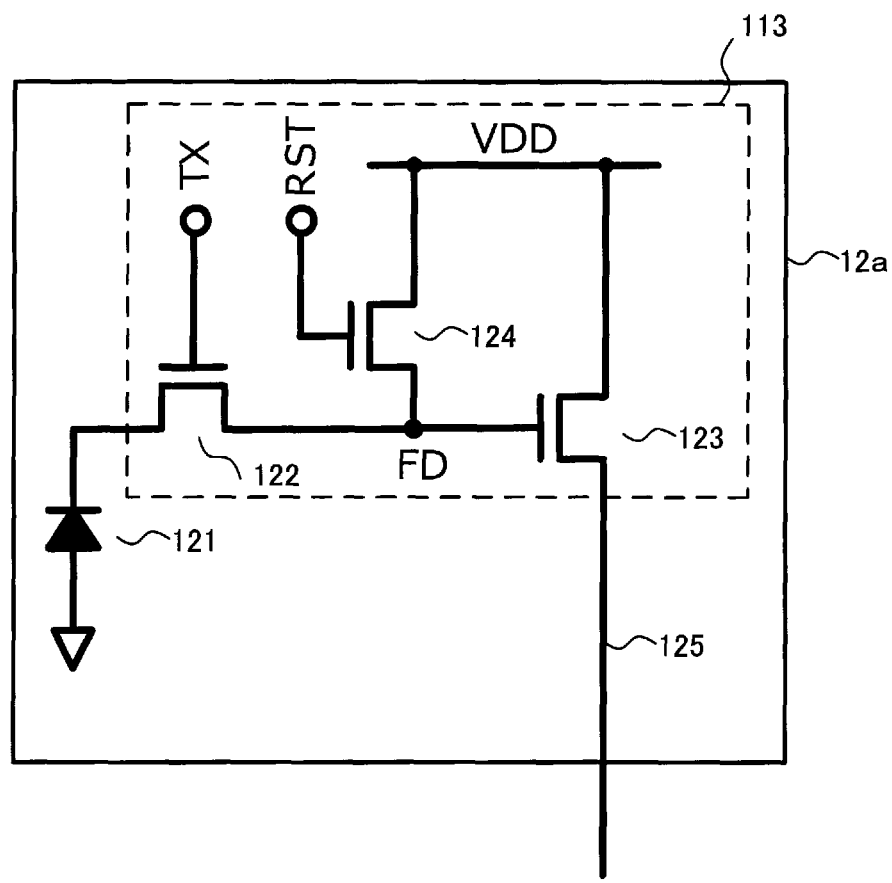
FIG. 2 is a circuit configuration diagram of a pixel circuit.

FIG. 1(A) is a configuration diagram of an electric current source circuit according to a first embodiment.

A storage circuit 111 has a storage unit including a capacitor Cb, an A/D converter 13, a memory 14, and a D/A converter 15, and a control unit including switches SW10 to SW14. The storage circuit 111 stores a voltage based on a reference electric current Ic outputted from a reference electric current source in the storage unit. The storage circuit 111 is connected to a gate terminal of an electric current source 112 composed of a MOS transistor Tr1 and supplies the stored voltage to the electric current source 112.

The electric current source 112 supplies a circuit 12 with an electric current based on the voltage stored in the storage unit. The storage unit has at least a capacitive element such as a capacitor having one electrode connected to a gate terminal of the MOS transistor Tr1 and the other electrode connected to a node having the same potential as that of a source terminal, for example.

The reference electric current Ic is inputted to the electric current source circuit 11 from a terminal P1. The reference electric current Ic is inputted to a drain of the MOS transistor Tr1 when the switch SW10 is turned off and the switches SW11 and SW12 are turned on. One end of the capacitor Cb is connected to a gate side of the MOS transistor Tr1 and the other end of the capacitor Cb is connected to a predetermined voltage terminal having the same potential as that of the source terminal of the MOS transistor Tr1. A drain side of the MOS transistor Tr1 is connected to the circuit 12 via the switch SW10. Furthermore, the drain side of the MOS transistor Tr1 is connected to the gate terminal and one end of the capacitor Cb via the switch SW12 so as to constitute a so-called diode connection and generate a bias voltage Vb. When the switches SW11 and SW12 are turned off and the switch SW10 is turned on, the MOS transistor Tr1 serving as the electric current source 112 generates a constant electric current Ic based on the bias voltage Vb and supplies the constant electric current Ic to the circuit 12. An example of the circuit 12 is a pixel circuit as described later.

The bias voltage Vb is connected to the A/D converter 13 via the switch SW13. The A/D converter 13 converts the bias voltage Vb, which is an analog value, into a digital value. The converted digital value is stored in the memory 14 to perform an initial setting. When the bias voltage Vb is reset in the capacitor Cb, the digital value stored in the memory 14 is read out and the bias voltage Vb corresponding to the read digital value is returned into an analog value by the D/A converter 15. The analog value is then applied to the capacitor Cb via the switch SW14. The bias voltage Vb can thus be reset without again inputting the reference electric current Ic from the terminal P1. Hereinafter, resetting of the bias voltage Vb is referred to as refreshing. Although the switches SW10 to SW14 are illustrated as switches in the figure for the sake of clarity, they include switching transistors and their opening and closing timings are controlled by signals from an external switching control circuit.

FIG. 1(B) is a time sequence diagram illustrating an operation of the switches SW10 to SW14 of the electric current source circuit 11 illustrated in FIG. 1(A). FIG. 1(B) illustrates on/off states of the switches SW10 to SW14 with the horizontal axis indicating times t1 to t5. This time sequence diagram is only exemplary and not limiting.

First, in a period from time t1 to time t2, the switch SW10 is turned off and the switches SW11 and SW12 are turned on. When the switches SW11 and SW12 are closed, the reference electric current Ic causes the bias voltage Vb to be held in the capacitor Cb. It should be noted that the switch SW12 is turned off immediately before the switch SW11 is turned off. This intends to prevent a reduction in the bias voltage Vb of the capacitor Cb when the switches SW12 and SW11 are simultaneously turned on at the time t2.

Then, in a period from time t2 to time t3, the switch SW13 is turned on. In other words, the bias voltage Vb is converted into a digital value by the A/D converter 13, and the converted digital value is stored in the memory 14. In other words, in the period from time t1 to time t3, an initial setting for storing the bias voltage Vb in the memory 14 is performed.

Next, after the time t2, the switch SW10 is turned on to supply the circuit 12 with the constant electric current Ic, as appropriate. In other words, the MOS transistor Tr1 serving as the electric current source 112 generates the constant electric current Ic based on the bias voltage Vb and supplies the constant electric current Ic to the circuit 12. It should be noted that the bias voltage Vb of the capacitor Cb slightly decreases over time.

In a period from time t4 to time t5, the switch SW14 is turned on to read out the digital value of the bias voltage Vb stored in the memory 14, return it into the analog value by the D/A converter 15, and apply the analog value to the capacitor Cb. The bias voltage Vb is thus refreshed.

After the time t3, the initial setting performed in the period from time t1 to time t3 is unnecessary. The bias voltage Vb is held in the capacitor Cb by appropriately refreshing in the same manner as described above for the period from time t4 to time t5. Here, the MOS transistor Tr1 serves as the electric current source 112.

FIG. 2 illustrates a pixel circuit 12a as an example of the circuit 12. It should be noted that the circuit 12 is not limited to the pixel circuit 12a and may be any circuit that is supplied with an electric current from the electric current source 112, and thus is not limited to a particular circuit.

The pixel circuit 12a includes a photoelectric converter 121 and a readout circuit 113. The photoelectric converter 121 has a photoelectric conversion function of converting incident light into an electric charge. The photoelectric converter 121 accumulates the electric charge resulting from the photoelectric conversion. The photoelectric converter 12 is composed of a photodiode, for example. The readout circuit 113 reads out a pixel signal to a signal line 125, the pixel signal being generated by the electric charge resulting from the photoelectric conversion performed by the photoelectric converter 121. The pixel signal represents image data, for example. The readout circuit 113 includes a transfer unit 122, a discharge unit 124, a floating diffusion FD, and an output unit 123.

The transfer unit 122 transfers the electric charge resulting from the photoelectric conversion performed by the photoelectric converter 121 to the floating diffusion FD. In other words, the transfer unit 122 forms an electric charge transfer path between the photoelectric converter 121 and the floating diffusion FD. The output unit 123 outputs a pixel signal to the signal line 125, the pixel signal being generated by the electric charge transferred by the transfer unit 122 from the photoelectric converter 121 to the floating diffusion FD. The output unit 123 is a transistor having a drain terminal, a gate terminal, and a source terminal that are respectively connected to a power supply VDD, the floating diffusion FD, and the signal line 125. The discharge unit 124 discharges the electric charge in the floating diffusion FD. The floating diffusion FD is reset to a reference potential as a result of the discharge of the electric charge by the discharge unit 124.

The MOS transistor Tr1 (see FIG. 1) constituting the electric current source 112 is connected to the readout circuit 113 via the signal line 125. The electric current source 112 supplies an electric current for causing the readout circuit 113 to read out the pixel signal generated by the electric charge resulting from the photoelectric conversion performed by the photoelectric converter 121. The electric current source 112 supplies an electric current to an output part 123 of the readout circuit 113. In other words, the output unit 123 constitutes an electronic circuit such as a source follower circuit with the electric current source 112 as a load electric current source.

The pixel circuit 12a includes, for example, a photodiode 121 as a photoelectric conversion element and has three transistors (i.e., a transfer transistor 122, an amplification transistor 123, and a reset transistor 124) as active elements for the single photodiode 121.

The photodiode 121 photoelectrically converts incident light into an electric charge having an amount depending on an amount of the incident light. The transfer transistor 122 is connected between the photodiode 121 and the floating diffusion FD. When a drive signal is applied to a gate of the transfer transistor 122 from a transfer control line TX, the transfer transistor 122 transfers the electric charge resulting from the photoelectric conversion performed by the photodiode 121 to the floating diffusion FD. The floating diffusion FD is connected to a gate of the amplification transistor 123. The amplification transistor 123 acts as a source follower and outputs a voltage depending on the potential of the floating diffusion FD.

Although not illustrated in FIG. 1, if the circuit 12 is the pixel circuit 12a, the circuit 12 may include an A/D converter that converts the photoelectric conversion signal read from the amplification transistor 123 into a digital signal. It should be noted that the A/D converter for digital conversion of the photoelectric conversion signal can also serve as the A/D converter 13, as described later.

According to the first embodiment, the bias voltage Vb is refreshed within the electric current source circuit 11 without introducing the reference electric current each time from the external reference electric current source. Thus, refreshing can be performed while the circuit 12 is in operation and power consumption related to the refreshing can be reduced.

First Variation of First Embodiment

Figure 3:
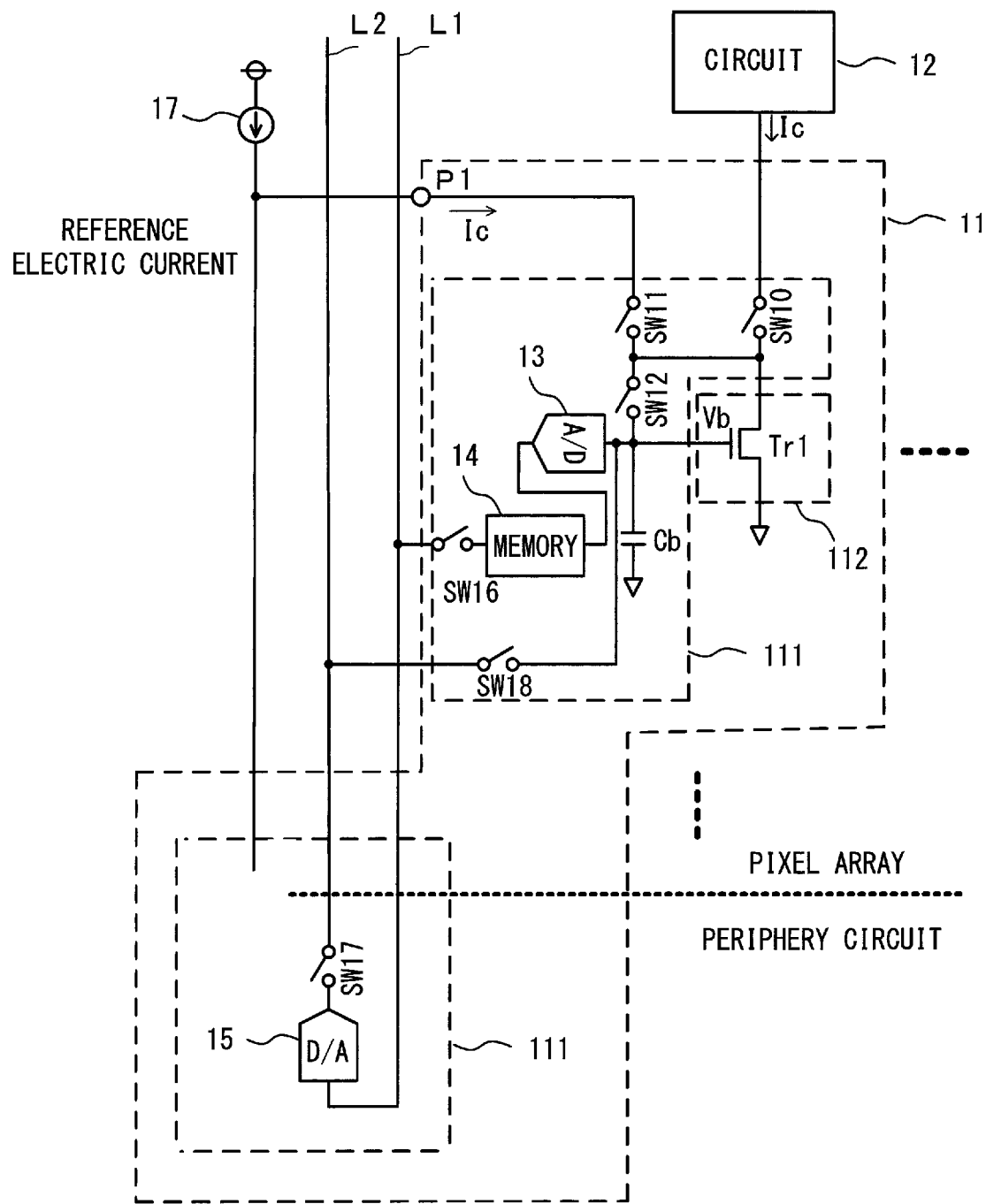
FIGS. 3(A), 3(B), and 3(C) illustrates an electric current source circuit according to a variation of the first embodiment.
Figure 3:
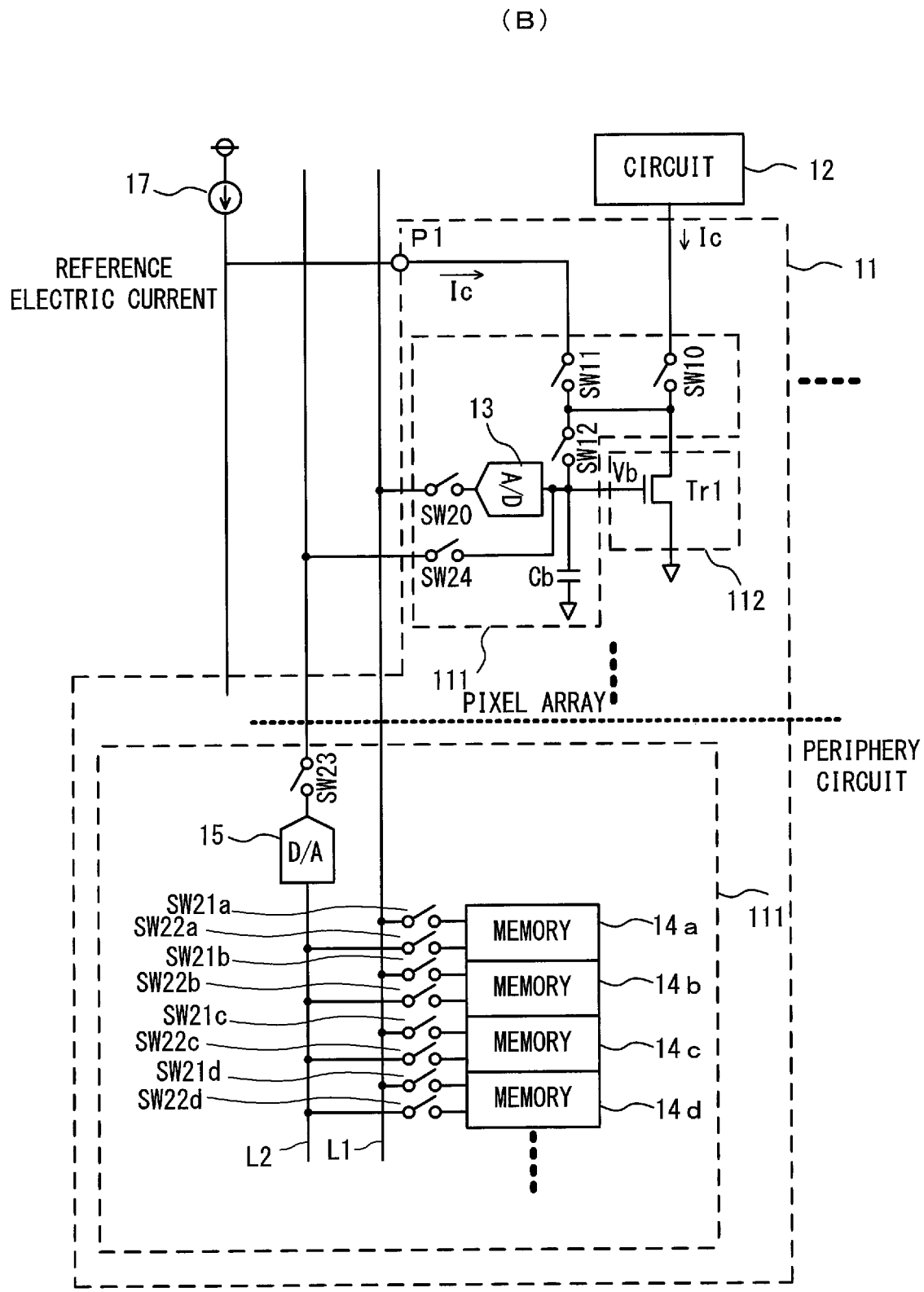
Figure 3:
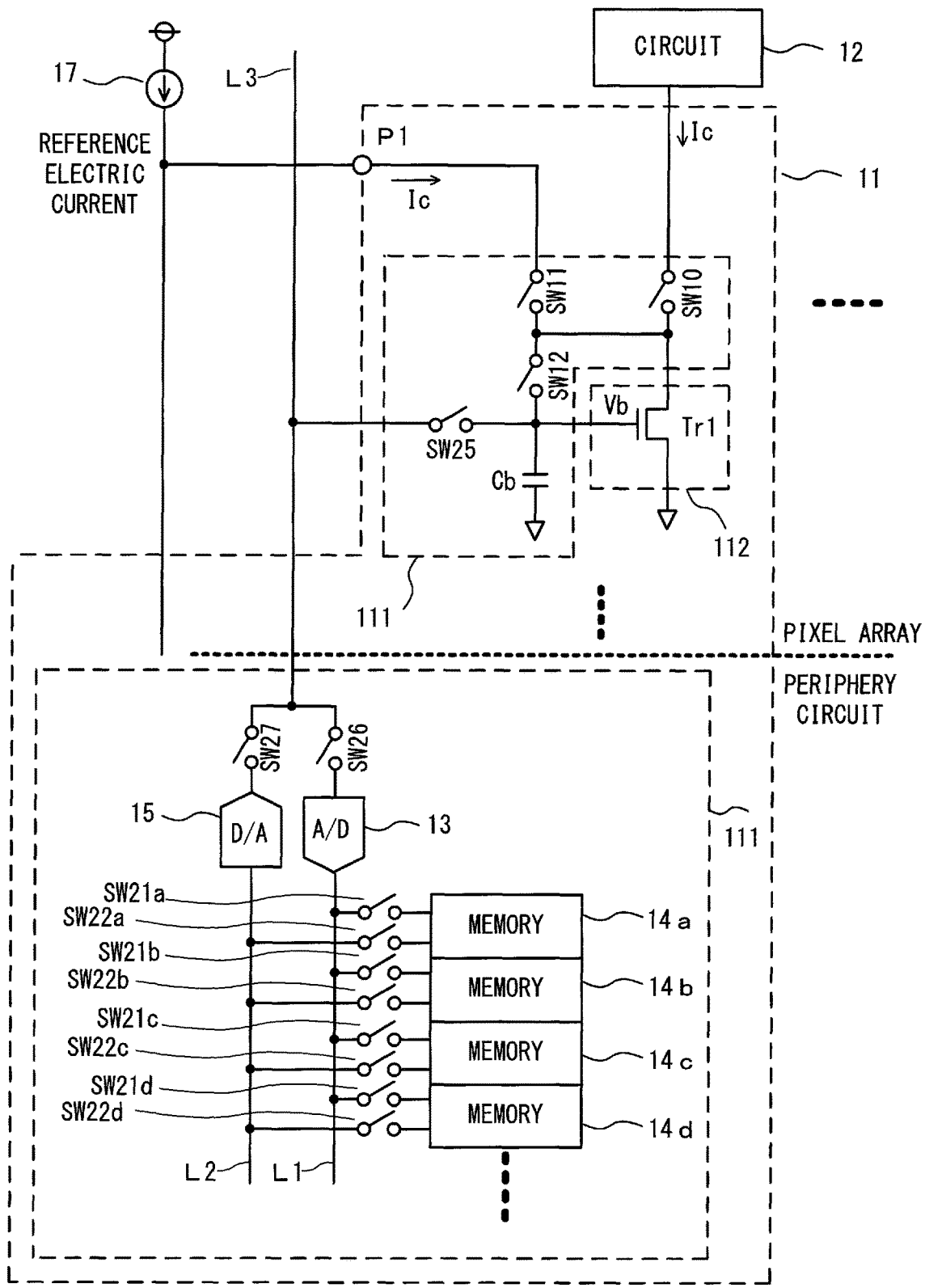

FIG. 3(A) illustrates an exemplary circuit in which a plurality of electric current source circuits 11 are arranged in rows and in columns. This is a variation of the electric current source circuit 11 illustrated in FIG. 1. FIG. 3(A) illustrates a configuration in which one D/A converter 15 constituting a part of the storage circuit 111 is provided for one column of the electric current source circuits 11. It should be noted that the same parts as those in FIG. 1 are denoted by the same reference numerals, and a description thereof is omitted.

The following description refers to FIG. 3(A). An output of each memory 14 of the electric current source circuit 11 is connected to a line L1 via a switch SW16. The line L1 is connected to the D/A converter 15, and the D/A converter 15 is connected to a line L2 via a switch SW17. The line L2 is connected to each switch SW18 of the electric current source circuit 11 and is connected to each capacitor Cb via each switch SW18. The lines L1 and L2 are provided for each column of the electric current source circuits 11. Furthermore, the reference electric current Ic is inputted from the reference electric current source 17 to the terminal P1 of each electric current source circuit 11.

In the above configuration, when the switch SW10 is turned off and the switches SW11 and SW12 are turned on, the reference electric current Ic is supplied to the drain of the MOS transistor Tr1. Then, the bias voltage Vb that causes the constant electric current Ic to flow through the MOS transistor Tr1 is held in the capacitor Cb. Next, the bias voltage Vb is converted into a digital value by the A/D converter 13, and the converted digital value is stored in the memory 14. The above process is the initial setting operation.

Then, the switches SW11 and SW12 are turned off and the switch SW10 is turned on, so that an electric current is supplied to the circuit 12. In other words, the MOS transistor Tr1 serving as the electric current source 112 generates a constant electric current Ic based on the bias voltage Vb and supplies the constant electric current Ic to the circuit 12.

Next, the switch SW16 is turned on to read out the digital value of the bias voltage Vb stored in the memory 14 and output it to the line L1. The digital value is then returned into an analog value by the D/A converter 15. The switches SW17 and SW18 are then turned on to apply the analog value to the capacitor Cb to reset the bias voltage Vb. In other words, the bias voltage Vb is refreshed. The refreshing is performed at a time on a row basis for the plurality of electric current source circuits 11 arranged in rows and in columns.

Here, the MOS transistor Tr1 constitutes the electric current source 112 and the circuit 12 constitutes an electronic circuit such as a source follower circuit. Furthermore, the capacitor Cb, the switches SW10 to SW12, SW16 to 18, the A/D converter 13, the memory 14, and the D/A converter 15 constitute the storage circuit 111. The electric current source 112 and the storage circuit 111 constitute the electric current source circuit 11.

This example eliminates the need for the D/A converter 15 included in each electric current source circuit 11. The circuit configuration of the electric current source circuit 11 can thus be simplified.

Second Variation of First Embodiment

FIG. 3(B) illustrates an exemplary circuit in which a plurality of electric current source circuits 11 are arranged in rows and in columns. This is a variation of the electric current source circuit 11 illustrated in FIG. 1. FIG. 3(B) illustrates a configuration in which one D/A converter 15 and one column of memories 14a, 14b, . . . are provided for one column of the electric current source circuits 11. It should be noted that the same parts as those in FIG. 1 are denoted by the same reference numerals, and a description thereof is omitted.

The following description refers to FIG. 3(B). An output of the A/D converter 13 is connected to a line L1 via a switch SW20. The line L1 is connected to memories 14a, 14b, . . . via switches SW21a, SW21b, . . . . A line L2 is connected to the memories 14a, 14b, . . . via the switches SW22a, SW22b, . . . . Additionally, the line L2 having the switches SW22a, SW22b, . . . connected thereto is commonly connected to the D/A converter 15. An output of the D/A converter 15 is connected to each capacitor Cb of the electric current source circuit 11 via switches SW23 and SW24. The lines L1 and L2 are provided for each column of the electric current source circuits 11. Furthermore, the reference electric current Ic is inputted from the reference electric current source 17 to the terminal P1 of each electric current source circuit 11.

In the above configuration, when the switch SW10 is turned off and the switches SW11 and SW12 are turned on, the reference electric current Ic is supplied to the drain of the MOS transistor Tr1. Then, the bias voltage Vb that causes the constant electric current Ic to flow through the MOS transistor Tr1 is held in the capacitor Cb. Next, the bias voltage Vb is converted into a digital value by the A/D converter 13, and the converted digital value is stored in the memory 14a. This operation is performed at a time for each row of the electric current source circuits 11 so that the bias voltage Vb is stored in the memories 14a, 14b, . . . . The above process is the initial setting operation.

Then, the switches SW11 and SW12 are turned off and the switch SW10 is turned on, so that an electric current is supplied to the circuit 12. In other words, the MOS transistor Tr1 serving as the electric current source 112 generates the constant electric current Ic based on the bias voltage Vb and supplies the constant electric current Ic to the circuit 12.

Next, the switches SW22a, SW22b, . . . are sequentially turned on for each row to read out digital values of the bias voltage Vb stored in the memories 14a, 14b, . . . and output them to the line L2. The digital value is then returned into an analog value by the D/A converter 15. The switches SW23 and SW24 are then turned on to apply the analog value to the capacitor Cb to reset the bias voltage Vb. In other words, the bias voltage Vb is refreshed. The refreshing is performed at a time on a row basis for the plurality of electric current source circuits 11 arranged in rows and in columns.

Here, the MOS transistor Tr1 constitutes the electric current source 112 and the circuit 12 constitutes an electronic circuit such as a source follower circuit. Furthermore, the capacitor Cb, the switches SW10 to SW12, SW20 to SW24, the A/D converter 13, the memory 14, and the D/A converter 15 constitute the storage circuit 111. The electric current source 112 and the storage circuit 111 constitute the electric current source circuit 11.

This example eliminates the need for the D/A converter 15 and the memory 14 included in each electric current source circuit 11. The electric current source circuit 11 can thus be simplified.

Third Variation of First Embodiment

FIG. 3(C) illustrates an exemplary circuit in which a plurality of electric current source circuits 11 are arranged in rows and in columns. This is a variation of the electric current source circuit 11 illustrated in FIG. 1. FIG. 3(C) illustrates a configuration in which one A/D converter 13, one column of memories 14a, 14b, . . . , and one D/A converter 15 are provided for one column of the electric current source circuits 11. It should be noted that the same parts as those in FIG. 1 are denoted by the same reference numerals, and a description thereof is omitted.

The following description refers to FIG. 3(C). An output of each capacitor Cb of the electric current source circuit 11 is connected to a line L3 via a switch SW25. The line L3 is connected to the A/D converter 13 via a switch SW26. An output of the A/D converter 13 is connected to the line L1, which in turn is connected to memories 14a, 14b, . . . via switches SW21a, SW21b, . . . . The line L2 is connected to memories 14a, 14b, . . . via switches SW21a, SW21b, . . . . Additionally, the line L2 having the switches SW22a, SW22b, . . . connected thereto is commonly connected to the D/A converter 15. An output of the D/A converter 15 is connected to each capacitor Cb of the electric current source circuit 11 via switches SW27 and SW25. The lines L1 to L3 are provided for each column of the electric current source circuits 11. Furthermore, the reference electric current Ic is inputted from the reference electric current source 17 to the terminal P1 of each electric current source circuit 11.

In the above configuration, when the switch SW10 is turned off and the switches SW11 and SW12 are turned on, the reference electric current Ic is supplied to the drain of the MOS transistor Tr1. Then, the bias voltage Vb that causes the constant electric current Ic to flow through the MOS transistor Tr1 is held in the capacitor Cb. Next, the bias voltage Vb is converted into a digital value by the A/D converter 13, and the converted digital value is stored in the memory 14a. This operation is performed at a time for each row of the electric current source circuits 11 so that the bias voltage Vb is stored in the memories 14a, 14b, . . . . The above process is the initial setting operation.

Then, the switches SW11 and SW12 are turned off and the switch SW10 is turned on so that an electric current is supplied to the circuit 12. In other words, the MOS transistor Tr1 serving as the electric current source 112 generates the constant electric current Ic based on the bias voltage Vb and supplies the constant electric current Ic to the circuit 12.

Next, the switches SW22a, SW22b, . . . are sequentially turned on for each row to read out digital values of the bias voltage Vb stored in the memories 14a, 14b, . . . and output them to the line L2. The digital value is then returned into an analog value by the D/A converter 15. The switches SW27 and SW25 are then turned on to apply the analog value to the capacitor Cb to reset the bias voltage Vb. In other words, the bias voltage Vb is refreshed. The refreshing is performed at a time on a row basis for the plurality of electric current source circuits 11 arranged in rows and in columns.

Here, the MOS transistor Tr1 constitutes the electric current source 112 and the circuit 12 constitutes an electronic circuit such as a source follower circuit. Furthermore, the capacitor Cb, the switches SW10 to SW12, SW20 to 27, the A/D converter 13, the memory 14, and the D/A converter 15 constitute the storage circuit 111. The electric current source 112 and the storage circuit 111 constitute the electric current source circuit 11.

This example eliminates the need for the A/D converter 13, the D/A converter 15, and the memory 14 included in each electric current source circuit 11. The configuration of the electric current source circuit 11 can thus be simplified.

Second Embodiment

Figure 4:
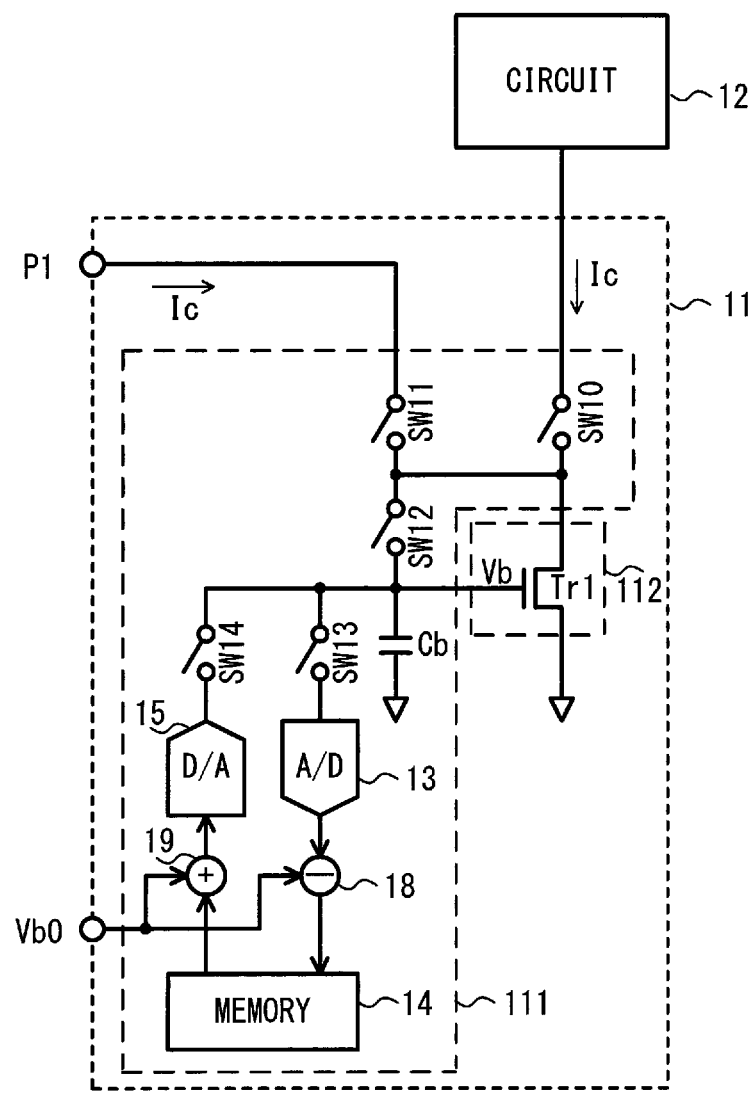
FIG. 4 illustrates an electric current source circuit according to a second embodiment.

FIG. 4 is a circuit configuration diagram illustrating a second embodiment. The same parts as those of the electric current source circuit 11 according to the first embodiment illustrated in FIG. 1 are denoted by the same reference numerals, and a description thereof is omitted. The second embodiment minimizes the number of bits of a digital value stored in the memory 14.

An initial setting of the bias voltage Vb in the memory 14 will be described. The bias voltage Vb of the MOS transistor Tr1 is connected to the A/D converter 13 via the switch SW13. The A/D converter 13 converts the bias voltage Vb, which is an analog value, into a digital value. The converted digital value is inputted to one input terminal of subtractor 18. A digital value Vb0 of a predetermined offset voltage is inputted to the other input terminal of the subtractor 18. The digital value Vb0 of the offset voltage is subtracted from the converted digital value by the subtractor 18, so that the subtraction result having a small number of bits is stored in the memory 14.

When the bias voltage Vb is reset in the capacitor Cb, that is, when refreshing is performed, the digital value stored in the memory 14 is read out and inputted to one input terminal of an adder 19. A digital value Vb0 of a predetermined offset voltage is inputted to the other input terminal of the adder 19. The read digital value and the digital value Vb0 of the offset voltage are added by the adder 19, so that the resulting added digital value has the original bit number. The digital value of the addition result is then inputted to the D/A converter 15 to return the bias voltage Vb corresponding to the digital value into an analog value and input it to the capacitor Cb.

It should be noted that the MOS transistor Tr1 constitutes the electric current source 112 and the circuit 12 constitutes an electronic circuit such as a source follower circuit. Furthermore, the capacitor Cb, the switches SW10 to SW14, the A/D converter 13, the memory 14, the D/A converter 15, the subtractor 18, and the adder 19 constitute the storage circuit 111. The electric current source 112 and the storage circuit 111 constitute the electric current source circuit 11.

According to the second embodiment, the number of bits of the digital value to be stored in the memory 14 can be minimized so that the circuit configuration of the electric current source circuit 11 can be reduced in size.

Third Embodiment

Figure 5:
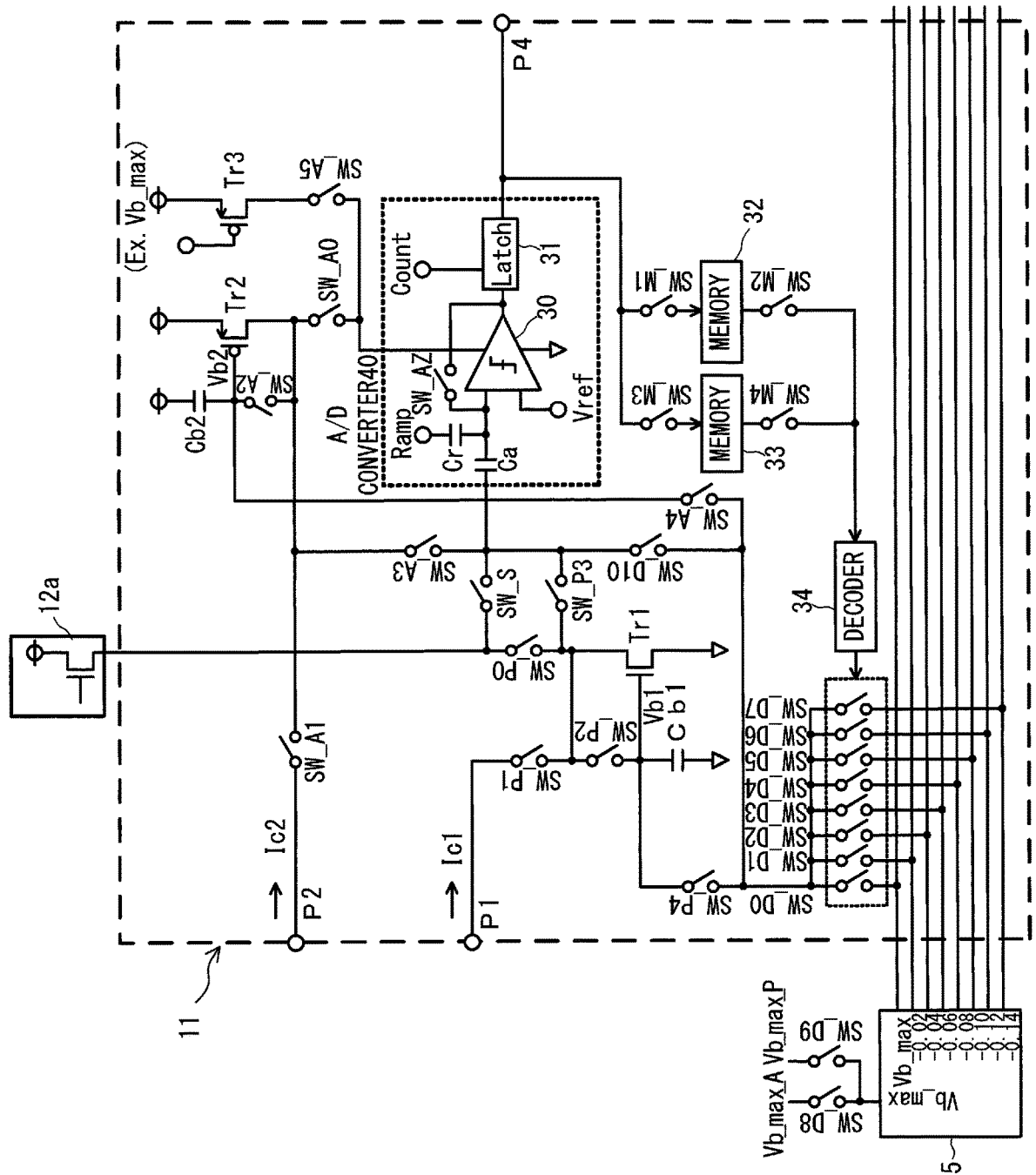
FIG. 5 illustrates an electric current source circuit according to a third embodiment.

FIG. 5 is a configuration diagram of an electric current source circuit according to a third embodiment.

A reference electric current Ic1 is inputted to the electric current source circuit 11 from a terminal P1. The reference electric current Ic1 is inputted to a drain of the MOS transistor Tr1 via a switch SW_P1. One end of the capacitor Cb1 is connected to the gate side of the MOS transistor Tr1 and the other end of the capacitor Cb is connected to a predetermined voltage terminal having the same potential as that of the source terminal of the MOS transistor Tr1. The drain side of the MOS transistor Tr1 is connected to a pixel circuit 12a via a switch SW_P0. The drain side of the MOS transistor Tr1 is connected to the gate terminal and one end of the capacitor Cb1 via switches SW_P2. A photoelectric conversion signal read from the pixel circuit 12a is connected to a capacitor Ca via a switch SW_S. The drain side of the MOS transistor Tr1 is connected to a capacitor Ca via a switch SW_P3. The pixel circuit 12a is the same as that described with reference to FIG. 2, and thus components other than the amplification transistor 123 are omitted in FIG. 5. The MOS transistor Tr1 serves as an electric current source of the pixel circuit 12a and the capacitor Cb1 supplies the electric current source with a bias voltage Vb1. The bias voltage Vb1 is refreshed in the present embodiment.

A reference electric current Ic2 is inputted to the electric current source circuit 11 from a terminal P2. The reference electric current Ic2 is inputted to a drain of the MOS transistor Tr2 via switches SW_A1 and SW_A2. In the example in FIG. 5, an electric current flows in a direction opposite to a direction of an arrow for Ic2 illustrated in the figure, since the transistor Tr2 is a PMOS transistor. One end of the capacitor Cb2 is connected to the gate side of the MOS transistor Tr2 and the other end of the capacitor Cb2 is connected to a predetermined voltage terminal. The drain side of the MOS transistor Tr2 supplies a constant electric current to the comparator 30 via the switch SW_A0. The switch SW_A2 is provided between the drain side and the gate side of the MOS transistor Tr2. The MOS transistor Tr2 functions as an electric current source of the comparator 30 and the capacitor Cb2 supplies the electric current source with a bias voltage Vb2. The bias voltage Vb2 is also refreshed in the present embodiment.

The MOS transistor Tr3 is connected to the comparator 30 via a switch SW_A5. The MOS transistor Tr3 is an electric current source for use in the initial setting of the bias voltage Vb2.

A capacitor Ca, and a capacitor Cr connected to a lamp voltage Ramp are inputted to an inverting input terminal of the comparator 30 for A/D conversion, and an output of the comparator 30 is also inputted via a switch SW_AZ. When the switch SW_AZ is in its on state, an auto-zero operation is performed. The lamp voltage Ramp is a voltage that gradually rises in a linear manner. The reference voltage Vref is inputted to an non-inverting input terminal of the comparator 30. The output of the comparator 30 is inputted to a latch circuit 31. A count signal Count is inputted to the latch circuit 31, and the count signal Count is counted until the comparator 30 is inverted.

The A/D converter 40 including the comparator 30 and the latch circuit 31 converts the photoelectric conversion signal from the pixel circuit 12a into a digital value and outputs it to a terminal P4. Furthermore, the A/D converter 40 converts the bias voltage Vb2 of the capacitor Cb2 into a digital value. The digital value is stored in the memory 32 via a switch SW_M1. Furthermore, the A/D converter 40 converts the bias voltage Vb1 of the capacitor Cb1 into a digital value. This digital value is stored in a memory 33 via a switch SW_M3.

The voltage value Vb2 stored as a digital value in the memory 32 is inputted to a decoder 34 via a switch SW_M2 and the voltage value Vb1 stored as a digital value in the memory 33 is inputted to the decoder 34 via a switch SW_M4. The decoder 34 decodes the voltage values Vb1 and Vb2 represented as digital values and turns on one of switches SW_D0 to SW_D7 corresponding to the decoding. Ends of the switches SW_D0 to SW_D7 are connected in common and connected to a capacitor Cb1 via a switch SW_P4 and to a capacitor Cb2 via a switch SW_A4. The other ends of the switches SW_D0 to SW_D7 are connected to a bias voltage source 35 supplied with a voltage value corresponding to the voltage values Vb1 and Vb2. It should be noted that a circuit including the decoder 34, the switches SW_D0 to SW_D7, and the bias voltage source 35 constitutes a D/A converter. Additionally, an initial voltage Vb_max_A and an initial voltage Vb_max_P are connected to the bias voltage source 35 via switches SW_D8 and SW_D9, respectively.

Here, the MOS transistor Tr1 constitutes the electric current source of the pixel circuit 12a and the pixel circuit 12a constitutes an electronic circuit such as a source follower circuit. Furthermore, the capacitor Cb1, the switches SW_P0 to SW_P4, the A/D converter 40, the memory 32, the decoder 34, and the switches SW_D0 to SW_D7 constitute a storage circuit for refreshing the electric current source.

Furthermore, the MOS transistor Tr2 constitutes an electric current source of the comparator 30 and the comparator 30 constitutes an electronic circuit. Moreover, the capacitor Cb2, the switches SW_A0 to SW_A5, the A/D converter 40, the memory 33, the decoder 34, and the switches SW_D0 to SW_D7 constitute a storage circuit for refreshing the electric current source.

Figure 6:
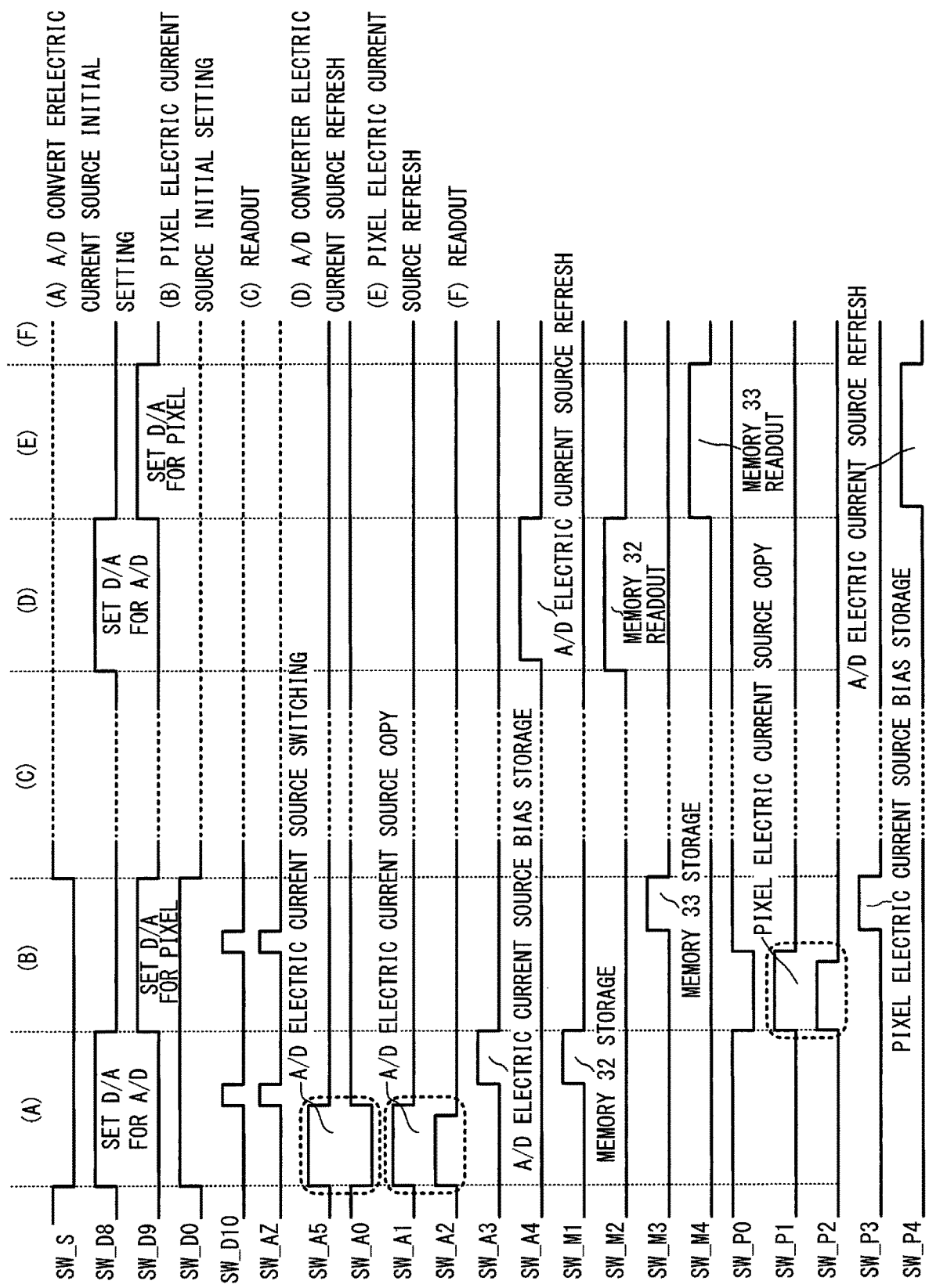
FIG. 6 is a time sequence diagram of an electric current source circuit according to the third embodiment.

An operation of the electric current source circuit 11 configured as described above will be described with reference to a time sequence diagram illustrated in FIG. 6. In FIG. 6, a horizontal axis indicates (a) initial setting of the electric current source of the A/D converter 40, (b) initial setting of the electric current source of the pixel circuit 12a, (c) photoelectronic conversion signal readout from the pixel circuit 12a, (d) refreshing of the electronic current source of the A/D converter 40, and (e) refreshing of the electric current source of the pixel circuit 12a, along with ON/OFF states of switches SW.

(a) Initial Setting of the Electric Current Source of the A/D Converter 40

As illustrated in FIG. 6, in the first half of the initial setting period of the electric current source of the comparator 30 for the A/D converter 40, the switch SW_A1 is turned on to supply the drain of the transistor Tr2 with the reference electric current Ic2 from the terminal P2 and the SW_A2 is turned on to hold the bias voltage Vb2 in the capacitor Cb2. Additionally, during this period, the switch SW_A0 is turned off and the switch SW_A5 is turned on so that the electric current source from the MOS transistor Tr3 is supplied to the comparator 30.

During the initial setting period of the electric current source of the comparator 30 for the A/D converter 40, the switches SW_D8 and SW_D0 are turned on. In other words, an initial voltage Vb_max_A is applied to the bias voltage source 35 so that a voltage Vb_max can be supplied via the switch SW_D0. Then, in the second half of the initial setting period of the electric current source for the A/D converter 40, a switch SW_D10 is first turned on so that the voltage Vb_max is inputted to the capacitor Ca. A switch SW_AZ is turned on in the same period as the switch SW_D10 to perform the auto-zero operation. Then, the switch SW_AZ is turned off and the switch SW_A3 is turned on so that the bias voltage Vb2 of the capacitor Cb2 is inputted to the capacitor Ca. In other words, the voltage applied to the capacitor Ca changes from the voltage Vb_max to the bias voltage Vb2. A voltage of the inverting input terminal of the comparator 30, therefore, changes from the reference voltage Vref to a voltage Vref'=Vref−(Vb_max−Vb2). In other words, a voltage based on the difference between the voltage Vb_max and the bias voltage Vb2 is applied to the inverting input terminal of the comparator 30. The voltage Vref' superimposed on a ramp voltage Ramp and the reference voltage Vref are then compared by the comparator 30, so that a count value is stored in the latch circuit 31 until the voltage Vref' is equal to the reference voltage Vref. The count value is stored in the memory 32 at a time when the switch SW_M1 is in its on state. The above process is the initial setting of the electric current source of the A/D converter.

(b) Initial Setting of the Electric Current Source of the Pixel Circuit 12a

As illustrated in FIG. 6, in the first half of the initial setting period of the electric current source of the pixel circuit 12a, the switch SW_P1 is turned on to supply the drain of the transistor Tr1 with the reference electric current Ic1 from the terminal P1 and the SW_P2 is turned on to hold the bias voltage Vb1 in the capacitor Cb1.

During the initial setting period of the electric current source of the pixel circuit 12a, the switches SW_D9 and SW_D0 are turned on. In other words, an initial voltage Vb_max_P is applied to the bias voltage source 35 so that a voltage Vb_max can be supplied via the switch SW_D0. Then, in the second half of the initial setting period of the electric current source of the pixel circuit 12a, a switch SW_D10 is first turned on so that the voltage Vb_max is inputted to the capacitor Ca. A switch SW_AZ is turned on in the same period as the switch SW_D10 to perform the auto-zero operation. Then, the switch SW_AZ is turned off and the switch SW_P3 is turned on so that the bias voltage Vb1 of the capacitor Cb1 is inputted to the capacitor Ca. In other words, a voltage inputted to the capacitor Ca changes from the voltage Vb_max to the bias voltage Vb1. A voltage of the inverting input terminal of the comparator 30, therefore, changes from the reference voltage Vref to a voltage Vref'=Vref–(Vb_max–Vb1). In other words, a voltage based on the difference between the voltage Vb_max and the bias voltage Vb1 is applied to the inverting input terminal of the comparator 30. The voltage Vref' superimposed on a ramp voltage Ramp and the reference voltage Vref are then compared by the comparator 30 so that a count value is stored in the latch circuit 31 until the voltage Vref' is equal to the reference voltage Vref. The count value is stored in the memory 33 at a time when the switch SW_M3 is in its on state. The above process is the initial setting of the electric current source of the pixel circuit 12a.

(c) Photoelectric Conversion Signal Readout from the Pixel Circuit 12a

When reading a photoelectric conversion signal from the pixel circuit 12a, the switch SW_S is turned on. The photoelectric conversion signal read from the pixel circuit 12a is converted into a digital value by the A/D converter 40 including the comparator 30 and the latch circuit 31, and the digital value is outputted from the terminal P4.

(d) Refreshing of the Electric Current Source of the A/D Converter 40

The switches SW_D8, SW_M2, and SW_A4 are turned on to read out the voltage value Vb2 stored in the memory 32. The voltage value Vb2 is decoded by the decoder 34. Depending on an output of the decoder 34, one of the switches SW_D0 to SW_D7 is turned on. Differential voltages from the initial voltage Vb_max_A are applied to the other ends of the switches SW_D0 to SW_D7. As a result, a voltage depending on the difference is applied to the capacitor Cb2 via the switch SW_A4 so that the bias voltage Vb2 is refreshed.

(e) Refreshing of the Electric Current Source of the Pixel Circuit 12a

The switches SW_D9, SW_M4, and SW_P4 are turned on to read out the voltage value Vb1 stored in the memory 33. The voltage value Vb1 is decoded by the decoder 34. Depending on an output of the decoder 34, one of the switches SW_D0 to SW_D7 is turned on. Differential voltages from the initial voltage Vb_max_P are applied to the other ends of the switches SW_D0 to SW_D7. As a result, a voltage depending on the difference is applied to the capacitor Cb1 via the switch SW_P4 so that the bias voltage Vb1 is refreshed.

Thereafter, the above-described processes of (c) photoelectric conversion signal readout from the pixel circuit 12a, (d) refreshing of the electric current source of the A/D converter 40, and (e) refreshing of the electric current source of the pixel circuit 12a are repeated, which eliminates the need for (a) initial setting of the electric current source of the A/D converter 40 and (b) initial setting of the electric current source of the pixel circuit 12a described above.

Although the switches SW_A0 to SW_A5, SW_M1 to SW_M4, SW_P0 to SW_P4, SW_D0 to SW_D10, and the like are illustrated as switches in the figures for the sake of clarity, they include switching transistors and their opening and closing timings are controlled by signals from an external switching control circuit.

The third embodiment has described an example in which (a) initial setting of the electric current source of the A/D converter 40 and (d) refreshing of the electric current source of the A/D converter 40 are performed. However, the above processes (a) and (d) may be omitted and the reference electric current Ic2 from the terminal P2 may be always used as the base of the electric current source of the A/D converter 40.

According to the third embodiment, the A/D converter of the photoelectric conversion signal also serves as the A/D converter of the bias voltage Vb. This can reduce the size of the circuit configuration and eliminates the need for power supplied from an external reference electric current source. It is thus possible to provide a circuit configuration having a low power consumption.

Fourth Embodiment

Figure 7:
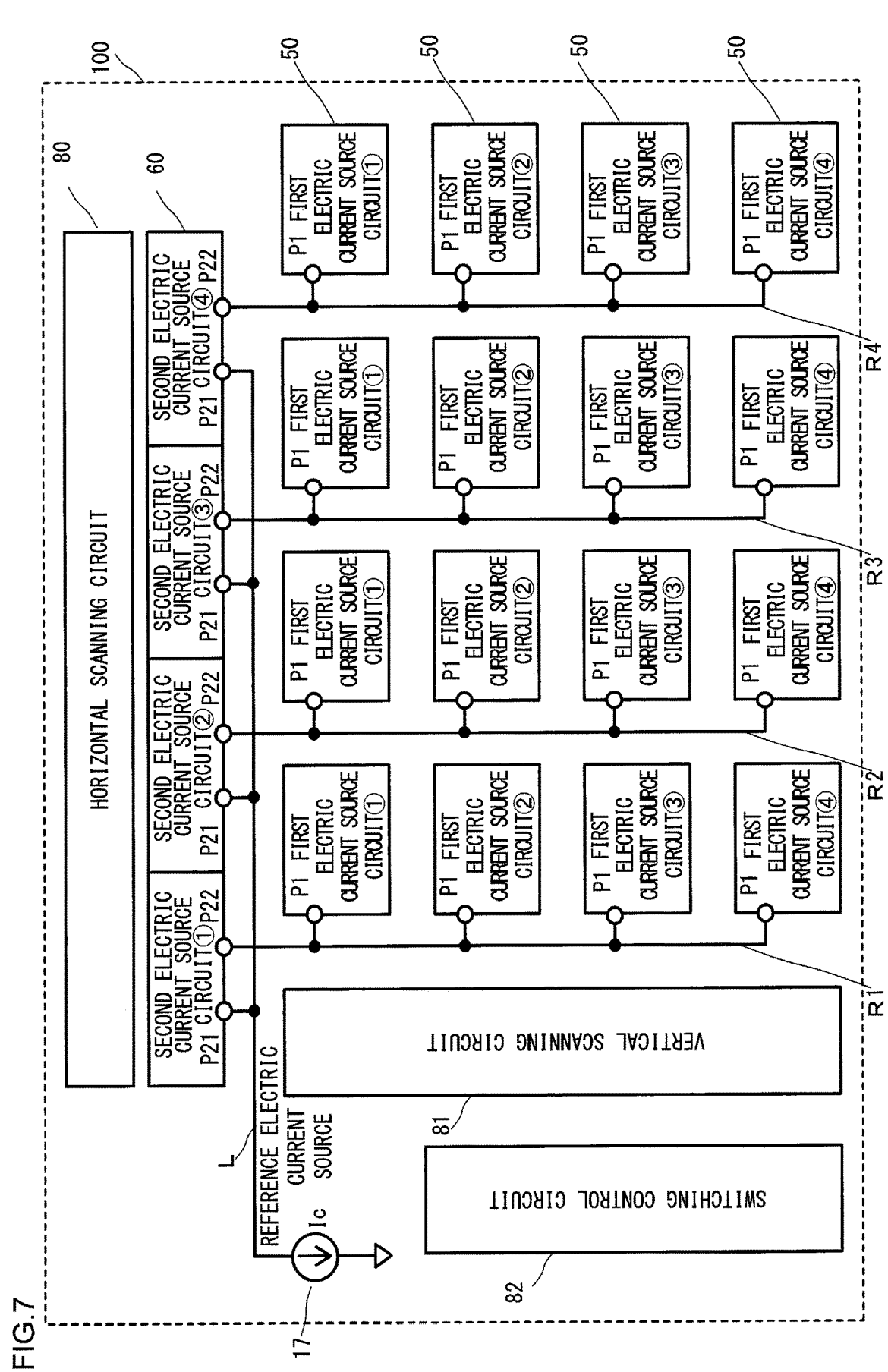
FIG. 7 illustrates a pixel chip according to a fourth embodiment.

FIG. 7 is a diagram illustrating a configuration of a pixel chip 100. The pixel chip 100 is composed of a semiconductor element as a single chip.

The following description refers to an example in which four first electric current source circuits 50 are arranged both in a row direction and in a column direction in the pixel chip 100. However, the number of the first electric current source circuits 50 is not limited. Each of the first electric current source circuits 50 may be described with reference to the electric current source circuit 11 illustrated in FIG. 1. It should be noted that each of the first electric current source circuits 50 may be the electric current source circuits 11 described in any one of the first to fourth embodiments. Four second electric current source circuits 60 are arranged in the row direction. The arrangement number is the same as the arrangement number of the first electric current source circuits 50 in the column direction. Details of the second electric current source circuit 60 will be described later.

The pixel chip 100 functions as a pixel chip when each of the first electric current source circuits 50 includes the pixel circuit 12a. In this case, a horizontal scanning circuit 80 and a vertical scanning circuit 81 for scanning the pixel circuits 12a are provided. Additionally, a switching control circuit 82 is provided that controls on and off of the switches in the first electric current source circuit 50 and the second electric current source circuit 60. It should be noted that the switching control circuit 82 may be provided outside the pixel chip 100.

Furthermore, the pixel chip 100 is provided with a reference electric current source 17, and a reference electric current Ic is inputted to a terminal P21 of each second electric current source circuit 60.

Figure 8:
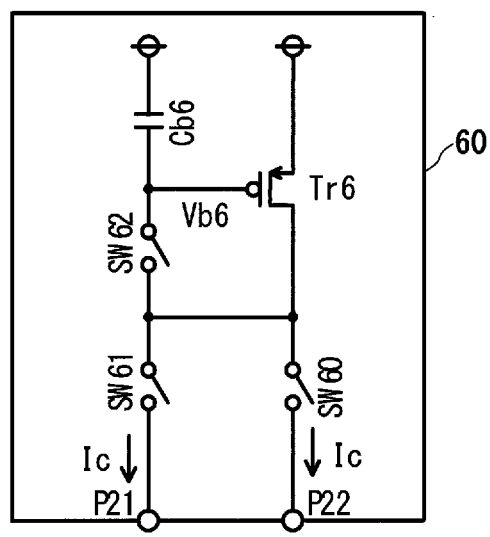
FIG. 8 illustrates a second electric current source circuit according to the fourth embodiment.

FIG. 8 is a diagram illustrating details of the second electric current source circuit 60. The reference electric current Ic inputted to the terminal P21 is supplied to the transistor Tr6 when the switches SW61 and SW62 are turned on, so that the bias voltage Vb6 is held in the capacitor Cb6.

Figure 9:
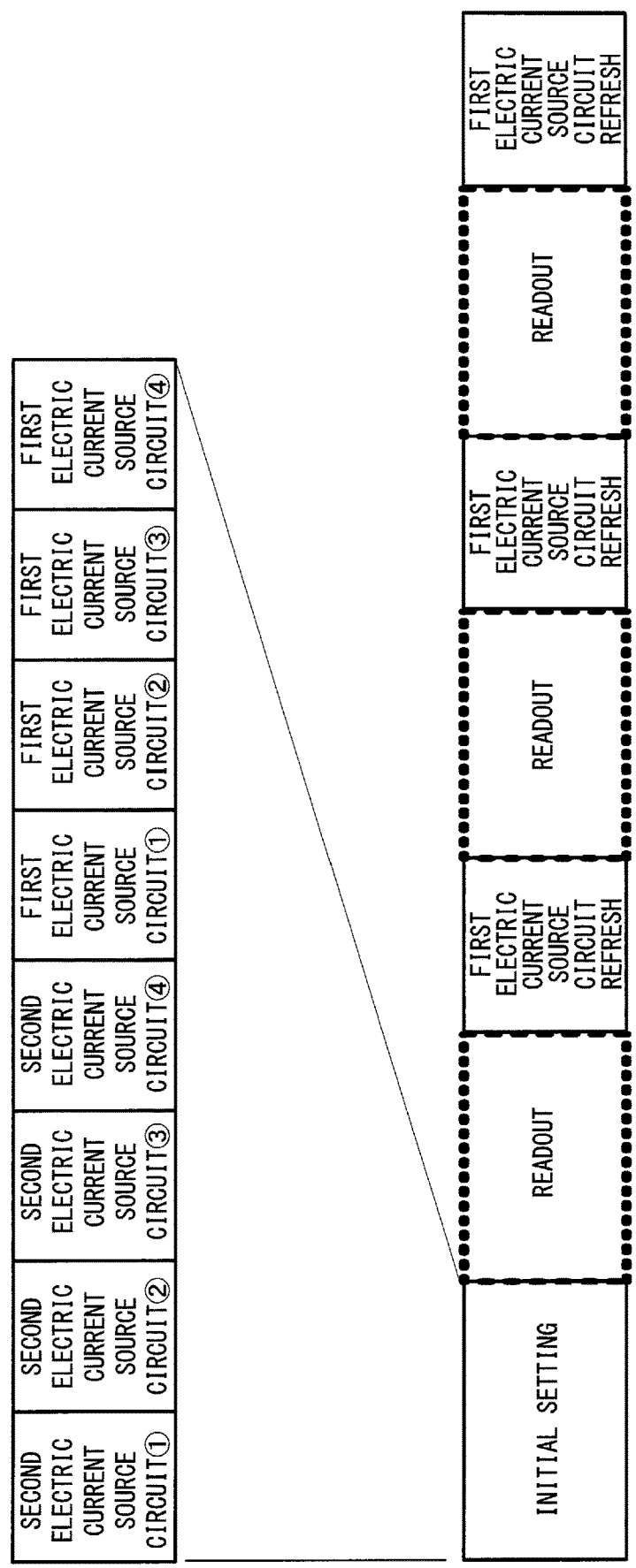
FIG. 9 is a time sequence diagram of the pixel chip according to the fourth embodiment.

FIG. 9 is a diagram illustrating a time sequence of the initial setting and refreshing of the pixel chip 100. The operation of the pixel chip 100 illustrated in FIG. 7 will be described with reference to FIG. 9.

First, one of the second electric current source circuits 60 is initialized. In other words, since the reference electric current Ic is inputted from the reference electric current source 17 to the terminal P21 of the second electric current source circuit 60 and the switches SW61 and SW62 of the second electric current source circuit 60 are turned on, the bias voltage Vb6 is held in the capacitor Cb6. This initial setting is performed for each of four second electric current source circuits 60 arranged in the row direction. Performing the initial setting four times completes the initial setting of the second electric current source circuit 60.

Next, the switches SW61 and SW62 of each second electric current source circuit 60 are turned off and the switch SW60 is turned on, so that the constant electric current Ic is outputted to the terminal P22 with the MOS transistor Tr6 as an electric current source. One example of the first electric current source circuit 50 is the electric current source circuit 11 illustrated in FIG. 1. The bias voltage Vb is held in the capacitor Cb by turning off the switch SW10 and turning on the switches SW11 and SW12 of the electric current source circuit 11. The operation of holding the bias voltage Vb in the capacitor Cb of the electric current source circuit 11 is performed simultaneously for one row of four first electric current source circuits 50 (electric current source circuits 11) which constitute the first row of the first electric current source circuits 50. Thereafter, a voltage value of the bias voltage Vb is converted into a digital value by the A/D converter 13 and the digital value is stored in the memory 14. The storage operation of the bias voltage Vb is sequentially performed for second to fourth rows. In this way, the initial setting of the second electric current source circuit 60 and the first electric current source circuit 50 is completed.

Next, the first electric current source circuit 50 (electric current source circuit 11) is refreshed. The refreshing has already been described with reference to FIG. 1. In other words, the digital value is read from the memory 14, is subjected to D/A conversion, and then applied to the capacitor Cb, so that the bias voltage Vb of the capacitor Cb is refreshed. This refreshing is performed at a time and simultaneously in each first electric current source circuit 50 (electric current source circuit 11).

As illustrated in FIG. 9, the photoelectric conversion signal readout operation and the refreshing operation are thereafter repeated. It should be noted that the photoelectric conversion signal readout operation is only exemplary and other operations of electronic circuits requiring an electric current source may be performed.

According to the present embodiment, refreshing of the first electric current source circuits 50 (electric current source circuits 11) can be performed at a time, so that the time required for refreshing can be significantly shortened.

Furthermore, in the present embodiment, the first electric current source circuit 50 (electric current source circuit 11) is provided with a circuit that performs A/D conversion of the bias voltage Vb and stores the result, and performs D/A conversion of the stored value to refresh the bias voltage Vb (hereinafter referred to as a "refresh circuit").

According to the above embodiment, the following operational advantages can be obtained.

(1) The electric current source circuit 11 includes the electric current source 112 of the electronic circuit 12 and the output circuit 111 that outputs a signal for generating an electric current to be supplied to the electronic circuit 12 by the electric current source 112, wherein the signal for generating the electric current is generated by a digital signal. As a result, an electric current to be supplied to the electronic circuit 12 can be generated.

(2) The storage circuit 111 connected to the electric current source 112 of the electronic circuit 12 includes the storage unit 14 that stores a digital signal used for supplying the electronic circuit 12 with an electric current, and an output unit that outputs a signal to the electric current source 112, the signal being generated by the digital signal stored in the storage unit 14. As a result, an electric current to be supplied to the electronic circuit 12 can be generated.

The present invention is not limited to the embodiments described above, and other aspects contemplated within the technical idea of the present invention are also included within the scope of the present invention as long as not impairing the features of the present invention. The embodiments and the plurality of variations described above may be combined.

The embodiments and variations described above also include the following image sensor and image-capturing apparatus.

(1) An image sensor comprising: a readout circuit that reads out a signal to a signal line, the signal being generated by an electric charge resulting from a photoelectric conversion; a storage circuit including an analog/digital converter that converts a first voltage signal based on an electric current from a first power supply circuit into a digital signal and a first storage unit that stores the first voltage signal converted into a digital signal by the analog/digital converter; and a first electric current source that supplies the signal line with an electric current generated by the first voltage signal stored in the first storage unit.

(2) In the image sensor as recited in (1), the first electric current source includes a first transistor having a drain part connected to the signal line and a gate part connected to the first storage unit and the drain part.

(3) In the image sensor as recited in (1) or (2), the storage circuit includes a digital/analog converter that converts the first voltage signal stored in the first storage unit into an analog signal; and
the first electric current source supplies the signal line with an electric current generated by the first voltage signal converted into the analog signal by the digital/analog converter.

(4) In the image sensor as recited in (3), the analog/digital converter converts the signal read by the readout circuit into a digital signal.

(5) In the image sensor as recited in (3) or (4), the analog/digital converter converts a second voltage signal based on an electric current from a second power supply circuit into a digital signal, the second power supply circuit being different from the first power supply circuit; and the storage circuit has a second storage unit that stores the second voltage signal converted into the digital signal by the analog/digital converter.

(6) In the image sensor as recited in (5), the storage circuit includes a second electric current source that supplies the analog/digital converter with an electric current generated by the second voltage signal stored in the second storage unit.

(7) In the image sensor as recited in (6), the digital/analog converter converts the second voltage signal stored in the second storage unit into an analog signal; and the second electric current source supplies the analog/digital convertor with an electric current generated by the second voltage signal converted into the analog signal by the digital/analog converter.

(8) An image-capturing apparatus comprising the image sensor as recited in (1) to (7).

(9) An electronic device comprising: an electronic circuit having a plurality of electronic components; a storage circuit including an analog/digital converter that converts a first voltage signal based on an electric current from a first power supply circuit into a digital signal, and a first storage unit that stores the first voltage signal converted into the digital signal by the analog/digital converter; and a first electric current source that supplies the electronic circuit with an electric current generated by the first voltage signal stored in the first storage unit.

(10) In the electronic device as recited in (9), the first electric current source includes a first transistor having a drain part connected to the electronic circuit and a gate part connected to the first storage unit and the drain part.

(11) In the electronic device as recited in (9) or (10), the storage circuit includes a digital/analog converter that converts the first voltage signal stored in the first storage unit into an analog signal; and the first electric current source supplies the electronic circuit with an electric current generated by the first voltage signal converted into the analog signal by the digital/analog converter.

(12) In the electronic device as recited in (11), the analog/digital converter converts a second voltage signal based on an electric current from a second power supply circuit into a digital signal, the second power supply circuit being different from the first power supply circuit; and the storage circuit has a second storage unit that stores the second voltage signal converted into the digital signal by the analog/digital converter.

(13) In the electronic device as recited in (12), the storage circuit includes a second electric current source that supplies the analog/digital converter with an electric current generated by the second voltage signal stored in the second storage unit.

(14) In the electronic device as recited in (13), the digital/analog converter converts the second voltage signal stored in the second storage unit into an analog signal; and the second electric current source supplies the analog/digital convertor with an electric current generated by the second voltage signal converted into the analog signal by the digital/analog converter.

(15) In the electronic device as recited in (9) to (14), the electronic circuit is a readout circuit that reads out a signal generated by an electric charge resulting from a photoelectric conversion.

The embodiments and variations described above also include the following image sensor and image-capturing apparatus.

(1) An electric current source circuit including an electric current source of an electronic circuit and an output circuit (storage circuit) that outputs a signal for generating an electric current to be supplied to the electronic circuit by the electric current source, wherein the signal is generated by a digital signal.

(2) In the electric current source circuit as recited in (1), the output circuit includes an analog/digital conversion circuit that converts an analog signal generated by an electric current from a reference electric current source into a digital signal, wherein the signal is generated by the digital signal converted by the analog/digital conversion circuit.

(3) In the electric current source circuit as recited in (2), the analog/digital conversion circuit has at least a comparison circuit including a first input unit that inputs an analog signal generated by an electric current from the reference electric current source, a second input unit that inputs a reference signal used for comparison with the analog signal inputted in the first input unit, and an output unit that outputs a result of comparison of the analog signal and the reference signal.

(4) In the electric current source circuit as recited in (2) or (3), the output circuit includes a storage circuit that stores the digital signal converted by the analog/digital conversion circuit, wherein the signal is generated by the digital signal stored in the storage circuit.

(5) In the electric current source circuit as recited in (4), the output circuit includes a digital/analog conversion circuit that converts the digital signal stored in the storage circuit into an analog signal, wherein the signal is generated by the analog signal converted by the digital/analog conversion circuit.

(6) In the electric current circuit as recited in (2) to (5), the electronic circuit has a photoelectric converter that converts light into an electric charge, and a readout circuit that reads out a photoelectric conversion signal to a signal line, the photoelectric conversion signal being generated by the electric charge resulting from the photoelectric conversion performed by the photoelectric converter, wherein the analog/digital conversion circuit converts the photoelectric conversion signal read out to the signal line by the readout circuit into a digital signal.

(7) In the electric current source circuit as recited in (1), the output circuit includes a digital/analog conversion circuit that converts a digital signal into an analog signal, wherein the signal is generated by the analog signal converted by the digital/analog conversion circuit.

(8) In the electric current circuit as recited in (7), the electronic circuit has a photoelectric converter that converts light into an electric charge and a readout circuit that reads out a photoelectric conversion signal to a signal line, the photoelectric conversion signal being generated by the electric charge resulting from the photoelectric conversion performed by the photoelectric converter.

(9) In the electric current source circuit as recited in (7) or (8), the electronic circuit is a comparison circuit that constitutes an analog/digital conversion circuit converting an analog signal into a digital signal.

(10) In the electric current source circuit as recited in (1), the output circuit includes a storage circuit that stores a signal generated by an electric current from a reference electric current source, wherein the signal is generated by a signal that is generated by an electric current from the reference electric current source stored in the storage circuit.

(11) In the electric current source circuit as recited in (10), the output circuit includes a digital/analog conversion circuit that converts the signal generated by the electric current from the reference electric current source stored in the storage circuit into an analog signal, wherein the signal is generated by the analog signal converted by the digital/analog conversion circuit.

(12) In the electric current circuit as recited in (10) or (11), the electronic circuit has a photoelectric converter that converts light into an electric charge and a readout circuit that reads out a photoelectric conversion signal to a signal line, the photoelectric conversion signal being generated by the electric charge resulting from the photoelectric conversion performed by the photoelectric converter.

(13) In the electric current source circuit as recited in (10) to (12), the electronic circuit is a comparison circuit that constitutes an analog/digital conversion circuit converting an analog signal into a digital signal.

(14) In the electric current source circuit as recited in (1) to (13), the electronic circuits constitute an array having a plurality of electronic circuits in rows and in columns, and the electric current source is provided for each of the plurality of electronic circuits.

(15) A storage circuit connected to an electric current source of an electronic circuit, including a storage unit that stores a digital signal used for supplying the electronic circuit with an electric current and an output unit that outputs a signal to the electric current source, the signal being generated by the digital signal stored in the storage unit.

(16) The storage circuit as recited in (15) includes an analog/digital converter that converts a signal generated by an electric current from a reference electric current source into a digital signal, wherein the storage unit stores the digital signal converted by the analog/digital converter.

(17) In the storage circuit as recited in (16), the analog/digital converter has a comparison circuit including a first input unit that inputs a signal generated by the electric current from the reference electric current source, a second input unit that inputs a reference signal used for comparison with the signal generated by the electric current from the reference electric current source inputted in the first input unit, and an output unit that outputs a result of comparison of the signal generated by the electric current from the reference electric current source and the reference signal.

(18) The storage circuit as recited in (16) or (17) includes a digital/analog converter that converts the digital signal stored in the storage unit into an analog signal, and the output unit outputs the signal generated by the analog signal converted by the digital/analog converter to the electric current source.

(19) In the storage circuit as recited in (16) to (18), the electronic circuit has a photoelectric converter that converts light into an electric charge and a readout circuit that reads out a photoelectric conversion signal to a signal line, the photoelectric conversion signal being generated by the electric charge resulting from the photoelectric conversion performed by the photoelectric converter, and the analog/digital conversion circuit converts the photoelectric conversion signal read out to the signal line by the readout circuit into a digital signal.

(20) In the storage circuit as recited in (15), the storage circuit includes a digital/analog converter that converts the digital signal stored in the storage unit into an analog signal, and the output unit outputs the signal generated by the analog signal converted by the digital/analog converter to the electric current source.

(21) In the storage circuit as recited in (20), the electronic circuit has a photoelectric converter that converts light into an electric charge and a readout circuit that reads out a pixel signal to a signal line, the pixel signal being generated by the electric charge resulting from the photoelectric conversion performed by the photoelectric converter, wherein the electric current source supplies the signal line with an electric current.

The disclosure of the following priority application is herein incorporated by reference:

Japanese Patent Application No. 2015-195282 (filed Sep. 30, 2015)

REFERENCE SIGNS LIST 11 current source circuit
Ic0 reference electric current
Cb capacitor
Vb bias voltage
Tr1 MOS transistor
12 circuits (electronic circuit)
13, 40 A/D converter
14, 32, 33 memory
15 D/A converter
18 subtractor
19 adder
12a pixel circuit
20 comparator
21 latch circuit
23, 34 decoder
24, 35 bias voltage source
50 first electric current source circuit
60 second electric current source circuit
70 third electric current source circuit
111 output circuit
112 current source
113 readout circuit
100, 200 pixel chip
300 circuit chip

The invention claimed is:

1. An image sensor comprising:
a pixel circuit including a photoelectric conversion unit that converts light into an electric charge and a readout circuit that reads out a signal to a signal line, the signal being generated by the electric charge resulting from a photoelectric conversion in the photoelectric conversion unit;
a storage circuit including an analog/digital converter that converts a first voltage signal based on an electric current from a first power supply circuit which is different from the pixel circuit into a digital signal and a first storage unit that stores the first voltage signal converted into a digital signal by the analog/digital converter; and
a first electric current source that supplies the signal line with an electric current generated by the first voltage signal stored in the first storage unit, wherein:
the storage circuit includes a digital/analog converter that converts the first voltage signal stored in the first storage unit into an analog signal; and
the first electric current source supplies the signal line with an electric current generated by the first voltage signal converted into the analog signal by the digital/analog converter.

2. The image sensor according to claim 1, wherein:
the analog/digital converter converts the signal read by the readout circuit into a digital signal.

3. The image sensor according to claim 1, wherein:
the analog/digital converter converts a second voltage signal based on an electric current from a second power supply circuit into a digital signal, the second power supply circuit being different from the first power supply circuit; and
the storage circuit has a second storage unit that stores the second voltage signal converted into the digital signal by the analog/digital converter.

4. The image sensor according to claim 3, wherein:
the storage circuit includes a second electric current source that supplies the analog/digital converter with an electric current generated by the second voltage signal stored in the second storage unit.

5. The image sensor according to claim 4, wherein:
the digital/analog converter converts the second voltage signal stored in the second storage unit into an analog signal; and the second electric current source supplies the analog/digital convertor with an electric current generated by the second voltage signal converted into the analog signal by the digital/analog converter.

6. An image-capturing apparatus comprising the image sensor according to claim 1.

7. An electronic device comprising:
an electronic circuit having a plurality of electronic components;
a storage circuit including an analog/digital converter that converts a first voltage signal based on an electric current from a first power supply circuit which is different from the electronic circuit into a digital signal, and a first storage unit that stores the first voltage signal converted into the digital signal by the analog/digital converter; and
a first electric current source that supplies the electronic circuit with an electric current generated by the first voltage signal stored in the first storage unit, wherein:
the storage circuit includes a digital/analog converter that converts the first voltage signal stored in the first storage unit into an analog signal; and
the first electric current source supplies the electronic circuit with an electric current generated by the first voltage signal converted into the analog signal by the digital/analog converter.

8. The electronic device according to claim 7, wherein:
the analog/digital converter converts a second voltage signal based on an electric current from a second power supply circuit into a digital signal, the second power supply circuit being different from the first power supply circuit; and
the storage circuit has a second storage unit that stores the second voltage signal converted into the digital signal by the analog/digital converter.

9. The electronic device according to claim 8, wherein:
the storage circuit includes a second electric current source that supplies the analog/digital converter with an electric current generated by the second voltage signal stored in the second storage unit.

10. The electronic device according to claim 9, wherein the digital/analog converter converts the second voltage signal stored in the second storage unit into an analog signal; and
the second electric current source supplies the analog/digital convertor with an electric current generated by the second voltage signal converted into the analog signal by the digital/analog converter.

11. The electronic device according to claim 7, wherein:
the electronic circuit is a readout circuit that reads out a signal generated by an electric charge resulting from a photoelectric conversion.

* * * * *